(12) United States Patent
Higo et al.

(10) Patent No.: US 11,761,108 B2
(45) Date of Patent: Sep. 19, 2023

(54) METHOD FOR PRODUCING INSULATED CIRCUIT BOARD USING A MASK AND PARTIAL PLATING METHOD USING THE MASK

(71) Applicant: DOWA METALTECH CO., LTD., Tokyo (JP)

(72) Inventors: Masaaki Higo, Tokyo (JP); Satoru Ideguchi, Tokyo (JP)

(73) Assignee: DOWA METALTECH CO., LTD., Tokyo (JP)

( * ) Notice: Subject to any disclaimer, the term of this patent is extended or adjusted under 35 U.S.C. 154(b) by 0 days.

(21) Appl. No.: 17/511,638

(22) Filed: Oct. 27, 2021

(65) Prior Publication Data
US 2022/0136126 A1    May 5, 2022

(30) Foreign Application Priority Data
Nov. 4, 2020    (JP) ................................ 2020-184591

(51) Int. Cl.
C25D 5/02        (2006.01)
H05K 3/18        (2006.01)

(52) U.S. Cl.
CPC ............. *C25D 5/022* (2013.01); *H05K 3/188* (2013.01); *H05K 2203/0723* (2013.01)

(58) Field of Classification Search
None
See application file for complete search history.

(56) References Cited

U.S. PATENT DOCUMENTS

2017/0253988 A1*    9/2017    Anderson ............ C25D 17/005

FOREIGN PATENT DOCUMENTS

| JP | 2004-250762 | 9/2004 |
| JP | 2014-196540 | 10/2014 |

OTHER PUBLICATIONS

English translation JP 2004-250762. (Year: 2004).*
English translation JP 2014-196540. (Year: 2014).*

* cited by examiner

*Primary Examiner* — Stefanie S Wittenberg
(74) *Attorney, Agent, or Firm* — Clark & Brody LP

(57) ABSTRACT

A mask for partial plating capable of performing partial electroplating selectively on a prescribed portion on a surface of an electrically isolated metal member provided on an insulated board is provided. Methods for producing an insulated circuit board and using the mask for partial plating are also provided. The mask for partial plating includes an insulated sheet member having an opening corresponding to the portion to be plated, and a structure including a partial region on one surface in the thickness direction of the insulated sheet member being coated with one or plural conductive sheet members attached to the region. The conductive sheet member is adhered to the surface of the insulated sheet member, for example, with an adhesive or an adhesive member. The conductive sheet member may be engaged in a recessed portion formed on the surface of the insulated sheet member.

14 Claims, 6 Drawing Sheets

METHOD FOR PRODUCING INSULATED CIRCUIT BOARD USING A MASK AND PARTIAL PLATING METHOD USING THE MASK

BACKGROUND OF THE INVENTION

Technical Field

The present invention relates to a "mask for partial plating" that is used for performing "partial plating" by an electroplating method selectively on a prescribed portion on a surface of an electrically isolated metal member formed on an insulated board, and for allowing the prescribed portion to be brought into contact with a plating solution. The present invention also relates to a method for producing an insulated circuit board and a partial plating method using the mask for partial plating.

Background Art

Semiconductor devices, such as a power module, generally use, as a component, an insulated circuit board including an insulated board, such as ceramics, having thereon a circuit metal member having a semiconductor element mounted on the surface thereof. The circuit metal member is frequently constituted by an aluminum based material or a copper based material. The semiconductor element is generally fixed to the circuit metal member via a solder layer or an Ag paste sintered layer. It is difficult to solder directly to an aluminum based material. A copper based material does not necessarily satisfy the wettability and the applicability to Pb-free solder and an Ag paste. Accordingly, in advance to the soldering or the sintering of a Ag paste, the surface of the circuit metal member is subjected to electroless plating or electroplating of a metal having good affinity to Pb-free solder or a Ag paste, such as Ni, a Ni alloy, Au, Ag, and Cu. By forming the plating selectively only on the portion where the semiconductor element is to be mounted, the positioning in mounting the semiconductor element can be efficiently performed by utilizing the poor wettability to the solder on the other portions.

In the case where the plating is formed through electroless plating, the following method has been generally employed: the portion on the surface of the circuit metal member other than the portion where the plating is formed is covered with a resist film. However, the formation and the removal of the resist film require much time and labor. Furthermore, the electroless plating method requires a longer processing time and a larger amount of chemical solutions than the electroplating method. For forming the plating by the electroplating method, on the other hand, it is necessary to supply electricity to the circuit metal member formed on the insulated board.

JP-A-2004-250762 describes a method of sealing a metal-ceramics composite member by closely attaching a masking member having openings thereto, and bringing a plating solution into contact therewith through the openings to perform electroless plating or electroplating. However, there is no specific description about how to secure the electricity supplying path from cathode power supply to the metal member to be plated, in performing electroplating. Since the masking member is closely attached for sealing, it may be assumed that electricity is supplied with a lead wire, such as an aluminum wire, provided between the ceramic board and the masking member, as described in JP-A-2014-196540, paragraph 0005, as the ordinary technique.

JP-A-2014-196540 considers that the local electricity supply using an aluminum wires or the like described above may be a factor of occurrence of an electrode mark and plating burn (see paragraph 0006), and describes a technique of using a mask member having a conductive member built in a non-conductive member. This technique also assumes that one surface of the mask member is attached closely to the metal circuit board (see, for example, claim 1 and paragraph 0017). Accordingly, the conductive member built in has a protruding part, and the protruding part (181b in FIG. 2B) exposed on the surface of the mask member is brought into contact with a part on the surface of the metal circuit board, so as to achieve supply of electricity to the metal circuit board.

SUMMARY OF THE INVENTION

For performing electroplating on a prescribed portion on a surface of an electrically isolated metal member disposed on an insulated board, it is necessary that the portion where plating is to be formed is brought into contact with a plating solution, and simultaneously electricity is supplied to the electrically isolated metal member from a cathode power supply. At this time, in the case where the portion not to be plated on the surface of the metal member is brought into contact with the conductive member by using the mask having a conductive member built in as described in JP-A-2014-196540, there is no necessity to insert a lead wire for supplying electricity to the gap between the mask and the insulated board, and thus efficient partial electroplating can be achieved without the phenomena including an electrode mark and plating burn. However, the conductive member built-in mask has a complex structure as described above, requiring high production cost. There is also a problem of too much time and labor for prompt production of a mask corresponding to the circuit pattern on schedule.

In view of the problems, an object of the present invention is to provide a mask for partial plating capable of performing partial electroplating selectively on prescribed portion on a surface of an electrically isolated circuit metal member provided on an insulated board, having a significantly simplified structure than ever. Another object thereof is to provide a partial plating method using that mask for partial plating capable of readily connecting an electric power source and a circuit metal member as a member to be plated, and a method for producing an insulated circuit board using the partial plating method.

The ordinary mask for partial plating assumes that the portion not to be plated and the conductive member for supplying electricity are completely shielded from the plating solution by closely attaching the edge of the opening to the member to be plated, as described in JP-A-2004-250762 and JP-A-2014-196540. However, as a result of the detailed investigation by the present inventors, it has been found that electroplating can be performed selectively on the prescribed portion on the surface of the metal member with accuracy that causes no practical problem even though the strict shielding is not necessarily secured. The present inventors also have found the structure of the mask for partial plating capable of readily connecting the electric power source and the circuit metal member as the member to be plated, and thus the present invention has been completed.

The objects can be achieved by a mask for partial plating used for performing electroplating selectively on a prescribed portion on a surface of one or plural electrically isolated metal members formed on an insulated board, and for allowing the prescribed portion to be brought into contact with a plating solution, and the mask for partial plating includes an insulated sheet member having an opening corresponding to the prescribed portion, and has a structure including a partial region on one surface in the thickness direction of the insulated sheet member being coated with one or plural conductive sheet members attached to the region.

It suffices that the conductive sheet member is adhered to the surface of the insulated sheet member, for example, with an adhesive or an adhesive member.

The conductive sheet member may be engaged in a recessed portion formed on the surface of the insulated sheet member. In this case, it suffices that a part or the whole of the thickness of the conductive sheet member is embedded in the recessed portion. In the case where the thickness of the conductive sheet member is equal to the depth of the recessed portion, and the whole of the thickness thereof is embedded in the recessed portion, a flat mask surface with no step between the exposed surface of the insulated sheet member and the exposed surface of the conductive sheet member can be formed. In this case, the shielding capability at the edge of the opening to the plating solution can be enhanced, which is advantageous for the formation of a plating layer having higher dimensional accuracy.

The present invention also relates to a method for producing an insulated circuit board including a circuit metal member having formed thereon a plated layer, including performing electroplating of an intermediate product of an insulated circuit board including an insulated board having one or plural electrically isolated circuit metal members formed on one surface of the insulated board, selectively on a prescribed portion on a surface of the circuit metal member, and the method includes using the aforementioned mask for partial plating, disposing the opening foiled in the mask to the prescribed portion to be plated on the surface of the circuit metal member for forming the plated layer, bringing the prescribed portion into contact with a plating solution, allowing the conductive sheet member exposed on the surface of the mask to be brought into contact with a portion not to be plated on the surface of the circuit metal member for forming the plated layer and an electrode conducted to an external electric power source, and supplying electricity to the circuit metal member for forming the plated layer, via the conductive sheet member, so as to perform electroplating.

The intermediate product of the insulated circuit board may include a ceramic board as the insulated board, and a heat radiation member provided on a back side of the insulated board opposite to the circuit metal member for forming the plated layer. In this case, it is possible that the heat radiation member is constituted by a conductor having a peripheral wall surrounding a part or the whole of end surfaces of the insulated board, and the peripheral wall of the heat radiation member is used as the electrode conducted to an external electric power source, so as to supply electricity to the circuit metal member for forming the plated layer. It is also possible that electricity is supplied to the circuit metal member for forming the plated layer by using, as the electrode conducted to an external electric power source, an external electrode that is not a constitutional member of the insulated circuit board. It is also possible that electricity is supplied to the plural circuit metal members for forming the plated layer via a single conductive sheet member disposed to be brought into contact simultaneously with the plural circuit metal members.

The present invention further relates to a partial plating method including performing electroplating selectively on a prescribed portion on a surface of one or plural electrically isolated circuit metal members formed on one surface of the insulated board, and the method includes using the aforementioned mask for partial plating, disposing the opening formed in the mask to the prescribed portion to be plated on the surface of the circuit metal member for forming a plated layer, bringing the prescribed portion into contact with a plating solution, allowing the conductive sheet member exposed on the surface of the mask to be brought into contact with a portion not to be plated on the surface of the circuit metal member for forming the plated layer and an electrode conducted to an external electric power source, and supplying electricity to the circuit metal member for forming the plated layer, via the conductive sheet member, so as to perform electroplating.

The insulated board may be a ceramic board having a heat radiation member provided on a back side thereof opposite to the circuit metal member for forming the plated layer. In this case, it is possible that the heat radiation member is constituted by a conductor having a peripheral wall surrounding a part or the whole of end surfaces of the insulated board, and the peripheral wall of the heat radiation member is used as the electrode conducted to an external electric power source, so as to supply electricity to the circuit metal member for forming the plated layer. It is also possible that electricity is supplied to the circuit metal member for forming the plated layer by using an external electrode as the electrode conducted to an external electric power source. It is also possible that electricity is supplied to the plural circuit metal members for forming the plated layer via a single conductive sheet member disposed to be brought into contact simultaneously with the plural circuit metal members.

In the description herein, more specifically, the following inventions are disclosed.

[1] A mask for partial plating used for performing electroplating selectively on a prescribed portion on a surface of one or plural electrically isolated metal members formed on an insulated board, and for allowing the prescribed portion to be brought into contact with a plating solution, the mask for partial plating including an insulated sheet member having an opening corresponding to the prescribed portion, and having a structure including a partial region on one surface in the thickness direction of the insulated sheet member being coated with one or plural conductive sheet members attached to the region.

[2] The mask for partial plating according to the item [1], wherein the conductive sheet member is adhered to the surface of the insulated sheet member.

[3] The mask for partial plating according to the item [1], wherein the conductive sheet member is engaged in a recessed portion formed on the surface of the insulated sheet member.

[4] A method for producing an insulated circuit board including an insulated board having on one surface of the insulated board a circuit metal member having formed thereon a plated layer, including performing electroplating of an intermediate product of an insulated circuit board including an insulated board having one or plural electrically isolated circuit metal members formed on one surface of the insulated board, selectively on a prescribed portion on a surface of the circuit metal member, the method including using the mask for partial plating according to any one of the items [1] to [3], disposing the opening formed in the mask to the prescribed portion to be plated on the surface of the circuit metal member for forming the plated layer, bringing the prescribed portion into contact with a plating solution, allowing the conductive sheet member exposed on the surface of the mask to be brought into contact with a portion not to be plated on the surface of the circuit metal member for forming the plated layer and an electrode conducted to an external electric power source, and supplying electricity to the circuit metal member for forming the plated layer, via the conductive sheet member, so as to perform electroplating.

[5] The method for producing an insulated circuit board according to the item [4], wherein the intermediate product of the insulated circuit board includes a ceramic board as the insulated board, and a heat radiation member provided on a back side of the insulated board opposite to the circuit metal member for forming the plated layer.

[6] The method for producing an insulated circuit board according to the item [5], wherein the heat radiation member is a conductor having a peripheral wall surrounding a part or the whole of end surfaces of the insulated board, and electricity is supplied to the circuit metal member for forming the plated layer by using the peripheral wall of the heat radiation member as the electrode conducted to an external electric power source, and bringing the conductive sheet member into contact with the peripheral wall.

[7] The method for producing an insulated circuit board according to the item [4], wherein electricity is supplied to the circuit metal member for forming the plated layer by using, as the electrode conducted to an external electric power source, an external electrode that is not a constitutional member of the insulated circuit board.

[8] The method for producing an insulated circuit board according to any one of the items [4] to [7], wherein electricity is supplied to the plural circuit metal members for forming the plated layer via a single conductive sheet member disposed to be brought into contact simultaneously with the plural circuit metal members.

[9] A partial plating method including performing electroplating selectively on a prescribed portion on a surface of one or plural electrically isolated circuit metal members formed on one surface of an insulated board, the method including using the mask for partial plating according to any one of the items [1] to [3], disposing the opening formed in the mask to the prescribed portion to be plated on the surface of the circuit metal member for forming a plated layer, bringing the prescribed portion into contact with a plating solution, allowing the conductive sheet member exposed on the surface of the mask to be brought into contact with a portion not to be plated on the surface of the circuit metal member for forming the plated layer and an electrode conducted to an external electric power source, and supplying electricity to the circuit metal member for forming the plated layer, via the conductive sheet member, so as to perform electroplating.

[10] The partial plating method according to the item [9], wherein the insulated board is a ceramic board having a heat radiation member provided on a back side thereof opposite to the circuit metal member for forming the plated layer.

[11] The partial plating method according to the item [10], wherein the heat radiation member is a conductor having a peripheral wall surrounding a part or the whole of end surfaces of the insulated board, and electricity is supplied to the circuit metal member for forming the plated layer by using the peripheral wall of the heat radiation member as the electrode conducted to an external electric power source, and bringing the conductive sheet member into contact with the peripheral wall.

[12] The partial plating method according to the item [9], wherein electricity is supplied to the circuit metal member for forming the plated layer by using an external electrode as the electrode conducted to an external electric power source.

[13] The partial plating method according to any one of the items [9] to [12], wherein electricity is supplied to the plural circuit metal members for forming the plated layer via a single conductive sheet member disposed to be brought into contact simultaneously with the plural circuit metal members.

The mask for partial plating of the present invention can be referred to as a "conductive sheet partially coated mask" as compared to the ordinary "conductive member built-in mask" described above, from the standpoint that the conductive sheet member is attached to cover a part of the surface of the insulated sheet member. The mask for partial plating can be readily produced due to the simple structure thereof. Accordingly, a mask corresponding to the circuit pattern can be produced promptly at low cost on schedule. The present invention contributes to the enhancement of productivity and the reduction of cost in the production of a heat radiation structure including an insulated circuit board for mounting a semiconductor element.

BRIEF DESCRIPTION OF DRAWINGS

FIGS. 2A, 2B, 2C1, and 2C2 are a plane view, a cross sectional view, and enlarged views respectively schematically showing the structure of the mask for partial plating of the present invention as a type including a conductive sheet member that is adhered to the surface of an insulated sheet member having a flat form.

DETAILED DESCRIPTION OF THE EMBODIMENTS

Figure 1A:
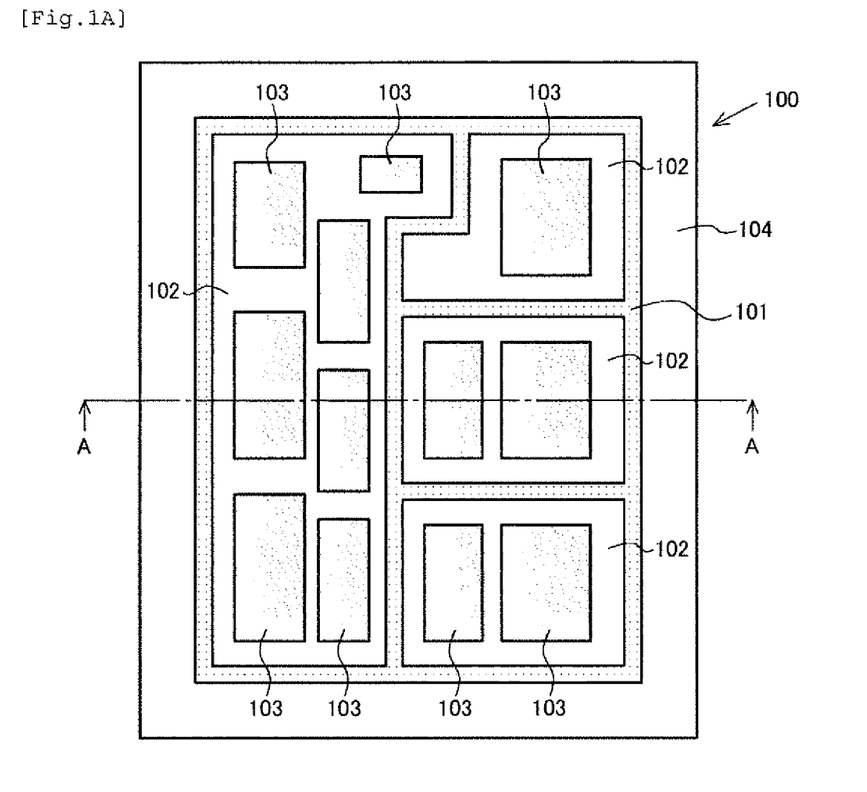
FIGS. 1A and 1B are a plane view and a cross sectional view respectively schematically showing the structure of an insulated circuit board (as a type including a peripheral wall) having a plated layer formed by using a mask for partial plating of the present invention.
Figure 1B:
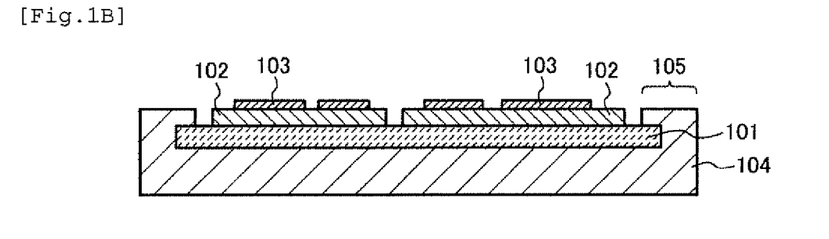

FIGS. 1A and 1B are a plane view and a cross sectional view respectively schematically showing an example of an insulated circuit board having a plated layer having been completed by using a mask for partial plating of the present invention. FIG. 1A is a plane view, and FIG. 1B is a cross sectional view on line A-A. A metal member 102 in a plate form is bonded to one surface of an insulated board 101, such as a ceramic board. The metal member 102 is a circuit metal member for mounting a semiconductor element, and in the example shown in the figures, four sheets of the metal members 102 are disposed in an island shape on the insulated board 101. The islands of the metal members 102 each are insulated from the other members with the insulated board 101, i.e., the metal members 102 as members to be plated each are electrically isolated. A plated layer 103 formed by using the mask for partial plating of the present invention exists on the surface of the metal member 102. The mask of the present invention is used for performing electroplating while supplying electricity to the electrically isolated member to be plated (i.e., the metal member 102).

The plated layer 103 is formed selectively on the portion on the metal member 102 corresponding to the position where a semiconductor element or the like is mounted. In the description herein, plating that is formed selectively on a prescribed portion on a surface of a member to be plated as in this manner is referred to as "partial plating". The metal member 102 is generally constituted by a metal having good conductivity, such as an aluminum based metal or a copper based metal. For improving the "solderability" for mounting a semiconductor element, plating is necessarily performed, as described above. In FIG. 1B, the thickness of the plated layer 103 is extremely exaggerated.

A heat radiation base 104 is bonded to the back side of the insulated board 101 opposite to the metal member 102, in the stage before forming the plated layer 103. In the use as a semiconductor device, heat generated from the semiconductor element is transferred to the heat radiation base 104 via the insulated board 101, and radiated outside via a chassis and a heat radiator. The heat radiation base 104 is generally constituted mainly by a metal having good thermal conductivity, such as an aluminum based metal or a copper based metal. In the example shown in the figures, the heat radiation base 104 has a peripheral wall 105, and is designed in such a manner that the height of the surface of the peripheral wall 105 is substantially equal to the height of the surface of the metal member 102. Accordingly, FIGS. 1A and 1B show an insulated circuit board 100 having the insulated board 101, the circuit metal member 102, and the heat radiation base 104, which are integrated with each other, in which particularly the surface of the metal member 102 and the surface of the peripheral wall 105 of the heat radiation base 104 are substantially in the same plane.

Figure 2A:
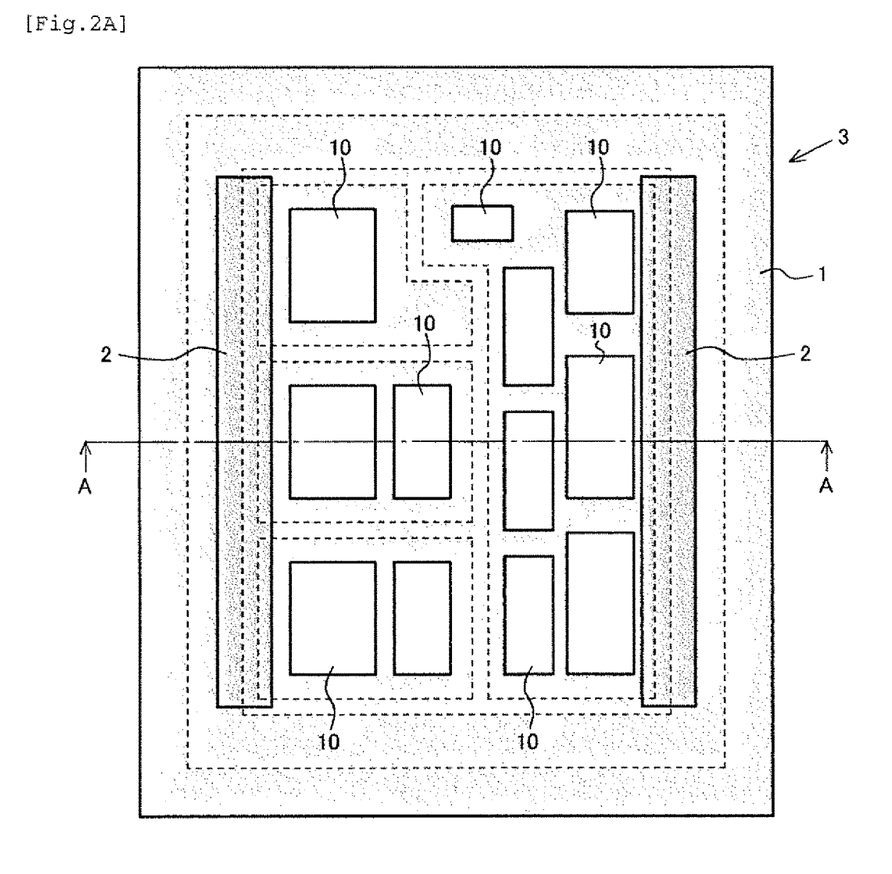
Figure 2B:
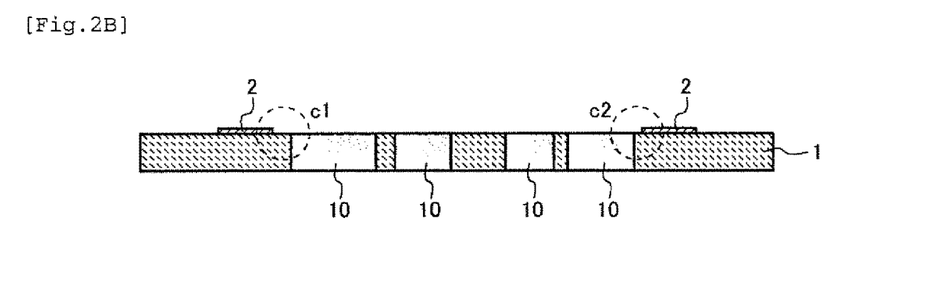
Figure 2C:
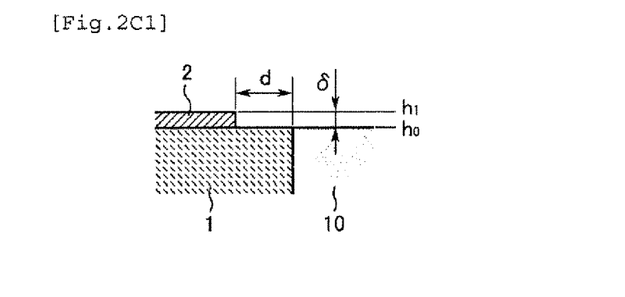
Figure 2C:
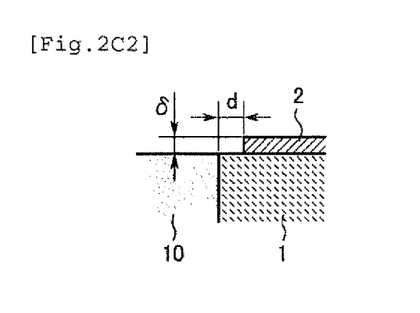

FIGS. 2A, 2B, 2C1, and 2C2 schematically show the structure of the mask for partial plating of the present invention. FIG. 2A is a plane view, and FIG. 2B is a cross sectional view on line A-A. Herein, the mask used for forming the plated layer 103 on the insulated circuit board 100 shown in FIGS. 1A and 1B is shown. In FIG. 2A, the regions overlapping the metal member 102 and the peripheral wall 105 the insulated circuit board 100 in FIGS. 1A and 1B in plating are shown by the broken lines for convenience. In plating, the insulated circuit board (denoted by the symbol 100 in FIGS. 1A and 1B) is disposed to overlap the upper surface of a mask for partial plating 3 in such a manner that the metal material as a member to be plated (denoted by the symbol 102 in FIGS. 1A and 1B) is directed downward. In the figures, the mask for partial plating 3 having a size that covers one insulated circuit board (denoted by the symbol 100 in FIGS. 1A and 1B) is shown as an example, but a mask for partial plating 3 having a size that covers plural insulated circuit boards simultaneously may be applied depending on the scale of the plating solution tank used.

The mask for partial plating 3 is constituted by an insulated sheet member 1 and a conductive sheet member 2 covering a partial region on a surface on one side in the thickness direction thereof. The insulated sheet member 1 has an opening 10 corresponding to the portion to be plated. The opening 10 penetrates the thickness of the insulated sheet member 1. The conductive sheet member 2 is brought into contact with the island of the electrically isolated metal member (denoted by the symbol 102 in FIGS. 1A and 1B), so as to supply electricity to the island. In the example shown in FIGS. 2A to 2C2, two sheets of the conductive sheet members 2 are adhered to the surface of the insulated sheet member 1, and the island of the metal member (denoted by the symbol 102 in FIGS. 1A and 1B) is brought into contact with any of the conductive sheet members 2 via the portion not to be plated on the surface thereof. Electricity is supplied from the external electric power source to the conductive sheet member 2 via the surface of the conductive sheet member 2 exposed on the surface of the mask for partial plating 3. In the examples shown in the figures, two sheets of the conductive sheet members 2 each are brought into contact with the peripheral wall (denoted by the symbol 105 in FIGS. 1A and 1B), so as to supply electricity thereto via the heat radiation base (denoted by the symbol 104 in FIGS. 1A and 1B). It is also possible that corresponding to the layout of the islands of the metal members as the member to be plated, for example, the conductive sheet member 2 that bears only electrification between the islands is provided, and thereby electricity is supplied to the islands via the other island.

The insulated sheet member 1 is preferably formed of a material that can be readily cut and has appropriate strength. The material also preferably has appropriate elasticity and flexibility for the enhancement of the close contact to the insulated circuit board. Specifically, a sheet material of insulating silicone rubber or the like may be applied. The thickness of the insulated sheet member 1 may be 0.3 to 10 mm, preferably 1 to 5 mm, and more preferably 2 to 4 mm. The conductive sheet member 2 may be a metal plate, conductive silicone rubber, or the like. The method of adhering the conductive sheet member 2 to the surface of the insulated sheet member 1 may be a method of using an adhesive, a method of adhering with an adhesive member, such as a double-sided adhesive tape, or the like. The metal plate may be aluminum, an aluminum alloy, copper, a copper alloy, titanium, a titanium alloy, a stainless steel, or the like. In most cases, the conductive sheet member 2 can connect among the islands of the metal members on the insulated board with a simple shape, such as a rectangle, viewed in the thickness direction as in FIG. 2A, and thus can be readily processed.

FIGS. 2C1 and 2C2 are enlarged views showing the portions denoted by the broken lines c1 and c2 in FIG. 2B. It is advantageous to reduce the step δ occurring between the surface of the insulated sheet member 1 and the surface of the conductive sheet member 2 from the standpoint of the efficient formation of the plated layer having high dimensional accuracy. It is also advantageous to secure an appropriate distance d from the end of the conductive sheet member 2 forming the step to the nearest opening 10. The step δ is usable when increased to approximately 1 mm in consideration of the elastic deformation, but is preferably 0.7 mm or less, and more preferably 0.15 mm or less. A material having a thickness as thin as possible is effectively used as the conductive sheet member 2 in the mask for partial plating 3 of the type having the conductive sheet member 2 adhered to the surface of the insulated sheet member 1.

In the case where step occurs (i.e., the case of δ>0), the following expressions (1) and (2) are preferably satisfied, and the following expressions (1) and (2)' are more preferably satisfied, from the standpoint of the formation of the plated layer 103 having dimensional accuracy as high as possible. In both cases above, the following expression (1)' is preferably applied instead of the expression (1).

$$d > 0 \quad (1)$$

$$d \geq 0.3 \quad (1)'$$

$$\delta/d \leq 0.7 \quad (2)$$

$$\delta/d \leq 0.15 \quad (2)'$$

In the expressions, d represents the minimum distance (mm) between the conductive sheet member 2 and the opening 10, and δ represents a value shown by $\delta = h_1 - h_0$, wherein $h_0$ represents the reference height $h_0 = 0$ (mm) of the exposed surfaces of the insulated sheet member 1 on the side having the conductive sheet member 2 thereon, and $h_1$ represents the height (mm) of the conductive sheet member.

In the case where the relationship of d and δ is defined as above, and an elastic material, such as silicone rubber, is used as the material of the insulated sheet member 1, the insulated sheet member 1 in the vicinity of the conductive sheet member 2 undergoes elastic deformation under the load pressing the insulated circuit board 100 onto the mask for partial plating 3, and thereby the insulated sheet member 1 and the metal member 102 can be substantially brought into closely contact to each other. Accordingly, the plating solution can be prevented from penetrating to the other portion than the opening 10 (i.e., to the gap between the insulated sheet member 1 and the metal member 102), enabling the formation of the plated layer 103 having higher dimensional accuracy.

Figure 3:
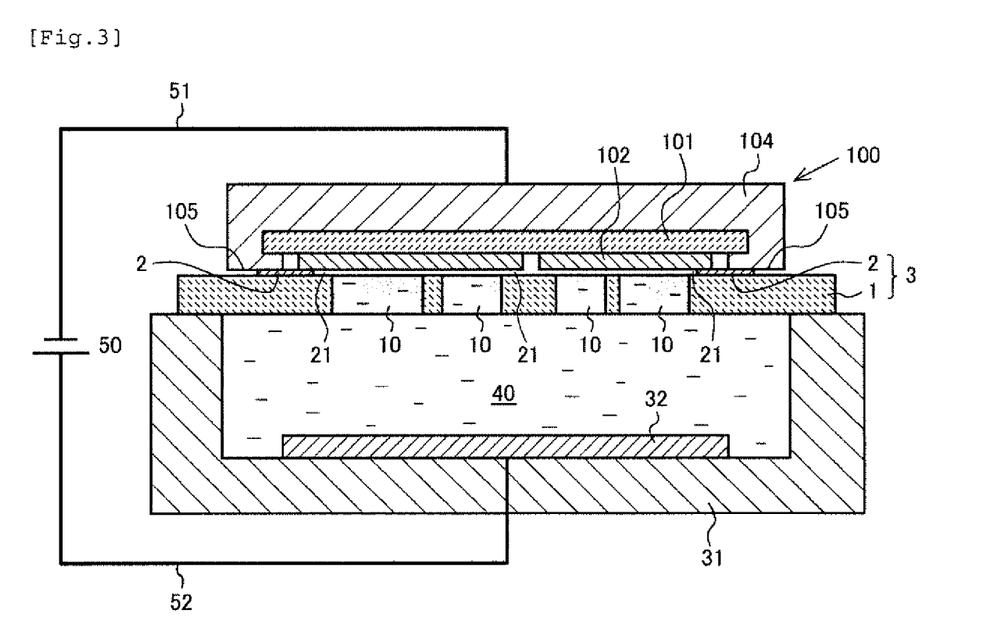
FIG. 3 is a cross sectional view schematically showing the cross sectional structure of the state where the mask for partial plating shown in FIGS. 2A, 2B, 2C1, and 2C2 and an insulated circuit board are disposed in a plating solution tank.

FIG. 3 schematically shows an example of the cross sectional structure of the state where the mask for partial plating shown in FIG. 2A and an insulated circuit board are disposed in a plating solution tank. The mask for partial plating 3 is placed on an upper side of a plating solution tank 31, and the insulated circuit board 100 is placed thereon. A prescribed load is applied downward in the vertical direction to the insulated circuit board 100. This figure shows the cross section corresponding to the cross section on line A-A in FIG. 2A. The conductive sheet member 2 exposed on the mask for partial plating 3 is brought into contact with the metal member 102 of the insulated circuit board 100 and the peripheral wall 105. The plating solution tank 31 is filled with a plating solution 40, which is an electrolytic solution, and thereby the metal member 102 as a member to be plated is immersed in the plating solution 40 in the portion of the opening 10 provided in the insulated sheet member 1. The heat radiation base 104, which is a constitutional member of the insulated circuit board 100, is a conductive material formed mainly of a metal, and therefore electricity on the cathode side is supplied from an external electric power source 50 to the metal member 102 via a conductive wire 51, the heat radiation base 104, and the conductive sheet member 2. On the other hand, electricity on the anode side is supplied from the external electric power source 50 to an anode electrode 32 disposed inside the plating solution tank 31 via a conductive wire 52. As the method for bringing the plating solution 40 into contact with the metal member 102 as a member to be plated, other known methods may be used, such as a method of spraying the plating solution 40 onto the opening 10.

In the example shown in the figure, the step δ occurs due to the conductive sheet member 2 adhered to the surface of the insulated sheet member 1, and therefore a gap 21 occurs between the insulated sheet member 1 and the metal member 102 as a member to be plated. It is considered that the plating solution 40 enters the gap 21. It has been expected in this case that the plating cannot be performed selectively only on the prescribed portion (i.e., the portion corresponding to the opening 10), and the plating solution 40 leaks outside through the gap 21 in the plating operation. However, as a result of the detailed investigations by the present inventors, it has been found that even though the plating solution 40 enters the gap 21, the deposition amount of the plating metal on the portion corresponding to the opening 10 is overwhelmingly larger than the deposition amount on the gap 21. Furthermore, it has also been found that in the case where the deposition proceeds to increase the thickness of the plated layer on the portion corresponding to the opening 10, the supply of the new plating solution (i.e., the supply of the electrolyte) to the gap 21 is delayed, inhibiting the deposition from occurring in the gap 21. Moreover, it has also been confirmed that the amount of the plating solution 40 that leaks outside through the gap 21 can be suppressed to such an extent that does not impair the plating operation, and the practical electroplating operation can be performed.

In the case where an elastic material, such as silicone rubber, is used as the material of the insulated sheet member 1, the insulated sheet member 1 undergoes elastic deformation in the vicinity of the conductive sheet member 2 due to the load pressing the insulated circuit board 100 onto the mask for partial plating 3, and therefore the insulated sheet member 1 and the metal member 102 can be brought substantially closely into contact with each other except for the portion around the conductive sheet member 2. In this case, efficient electroplating can be performed by further suppressing the deposition on the portion other than the prescribed portion corresponding to the opening 10. Accordingly, it is advantageous for efficiently forming the plated layer 103 having higher dimensional accuracy.

In the case where the material of the insulated sheet member 1 is too soft or too large in size, there is a possibility that the intended close contact to the insulated circuit board 100 becomes insufficient due to deflection occurring therein. In this case, it is preferred that a base member, which is not shown in the figure, formed of a relatively hard resin or the like is provided on the lower side (i.e., on the side of the plating solution) of the insulated sheet member 1 in FIG. 3. The base member may have a plate form and may be formed of a material having higher hardness than the insulated sheet member 1, such as silicone rubber, Bakelite, acrylic resins, or vinyl chloride resins. An opening is also provided in the base member in the portion corresponding to the opening of the insulated sheet member 1 so as not to impair the contact of the plating solution. The mask for partial plating 3 having the base member having laminated thereon the insulated sheet member 1 may also be used.

Figure 4:
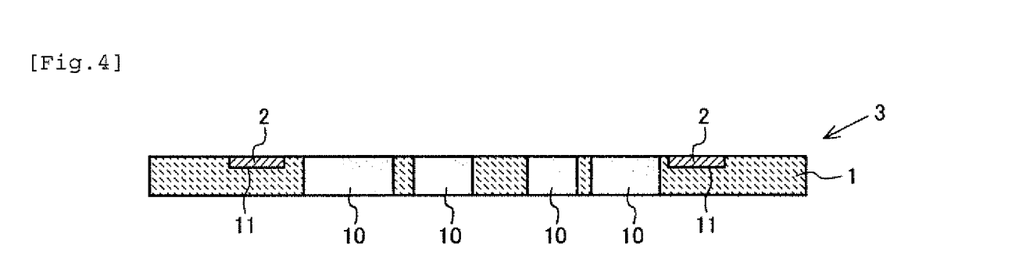
FIG. 4 is a cross sectional view schematically showing the cross sectional structure of the mask for partial plating of the present invention as a type including the conductive sheet member that is engaged in a recessed portion formed on the surface of the insulated sheet member.

FIG. 4 schematically shows the cross sectional structure of the mask for partial plating of the present invention as a type including the conductive sheet member that is engaged in a recessed portion formed on the surface of the insulated sheet member. The arrangement of the opening 10 and the disposition of the conductive sheet member 2 viewed in the thickness direction of the mask for partial plating 3 are the same as in FIG. 2A. The cross section shown in FIG. 4 corresponds to the A-A cross section in FIG. 2A. The conductive sheet member 2 is engaged in the recessed portion 11 formed on one surface of the insulated sheet member 1. In this case, the surface of the insulated sheet member 1 and the exposed surface of the conductive sheet member 2 can be flat. In the example shown in FIG. 4, there is no step between the members, and the value of the step $\delta$ is zero. In the case where the thickness of the conductive sheet member 2 is larger than the depth of the recessed portion 11, the relationship $\delta > 0$ stands, which is effective in the case where the contact pressure to the surface of the metal member (denoted by the symbol 102 in FIG. 1) as a member to be plated is to be increased. In the case of $\delta > 0$, it is effective that the expressions (1) and (2) are satisfied, and it is more effective that the expressions (1) and (2)' are satisfied, as described above. It is more preferred that the expression (1)' is satisfied instead of the expression (1). On the other hand, the relationship $\delta < 0$ can be intentionally achieved by decreasing the thickness of the conductive sheet member 2 to be smaller than the depth of the recessed portion 11. The mask for partial plating having this structure has a protruded portion on the surface of the metal member (denoted by the symbol 102 in FIGS. 2A to 2C2) as a member to be plated, and is effective in the case where electricity is supplied via the protruded portion.

The method for fixing the conductive sheet member 2 in the recessed portion 11 may be a method of utilizing the elastic stress occurring between the end surface of the conductive sheet member 2 and the wall surface of the recessed portion 11 (i.e., only engagement), or a method using an adhesive or an adhesive member.

(Example of Production Method of Insulated Sheet Member Having Recessed Portion)

The insulated sheet member 1 having the recessed portion 11 can be produced by engraving an insulated sheet plate material. In alternative, an "adhesion method" may be used as a relatively simple method, an example of which is shown below. It is assumed that the depth of the recessed portion of the insulated sheet member 1 is $t_1$ (mm), and the thickness of from the bottom of the recessed portion to the back surface of the insulated sheet member 1 is $t_2$ (mm). The thickness of the insulated sheet member 1 (i.e., the distance between the exposed surfaces on both sides) is $t_1+t_2$. A first insulated sheet having a flat surface having a thickness of $t_2$ and a second insulated sheet having a thickness of $t_1$ and having an opening punched out at a portion corresponding to the recessed portion are prepared and adhered to each other with an adhesive or the like, so as to produce the insulated sheet member 1 having the prescribed recessed portion 11. The opening 10 may be formed after the adhesion, or an opening corresponding to the opening 10 may be formed in each of the first insulated sheet and the second insulated sheet in advance. Depending on the layout of the recessed portion, it is also possible that the second insulated sheet is constituted by plural independent sheets, which are then adhered to the prescribed positions on the first insulated sheet, so as to form the recessed portion 11.

Figure 5:
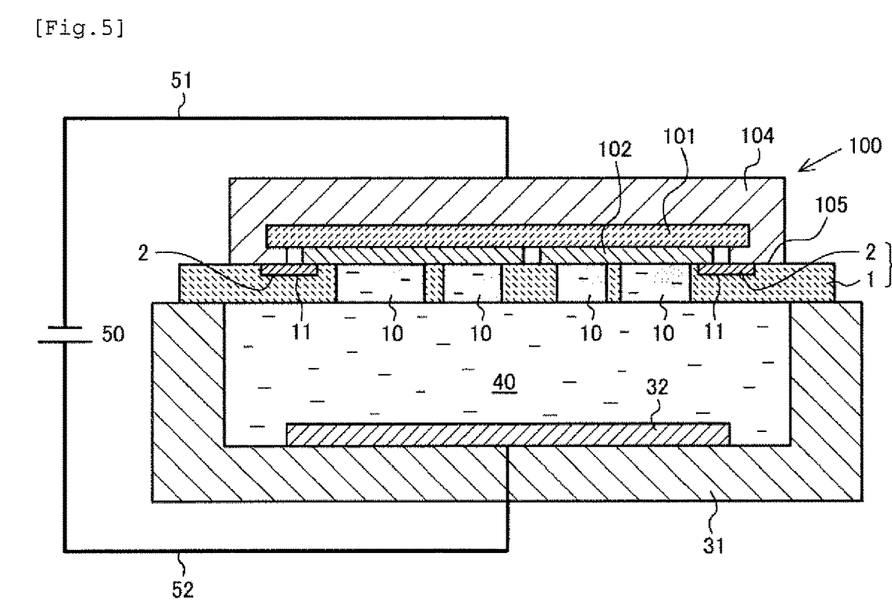
FIG. 5 is a cross sectional view schematically showing the cross sectional structure of the state where the mask for partial plating shown in FIG. 4 and an insulated circuit board are disposed in a plating solution tank.

FIG. 5 schematically shows an example of the cross sectional structure of the state where the mask for partial plating of the present invention shown in FIG. 4 and an insulated circuit board are disposed in a plating solution tank. The figure shows the cross section corresponding to the cross section shown in FIG. 4. While the overall structure is the same as in FIG. 3, the example shown in FIG. 5 has no step between the surface of the conductive sheet member 2 and the surface of the insulated sheet member 1 (i.e., $\delta = 0$), and therefore a gap (i.e., the portion corresponding to the symbol 21 in FIG. 3) is not formed between the insulated sheet member 1 of the mask and the metal member 102 as a member to be plated. Accordingly, the surface of the metal member 102 is brought closely into contact with the insulated sheet member 1 and the conductive sheet member 2 over the entire region except for the opening 10. Since the plating metal is deposited only on the prescribed region facing the opening 10, the electric current loss due to the deposition on the other portions can be prevented, and the plated layer having higher dimensional accuracy can be formed.

Figure 6A:
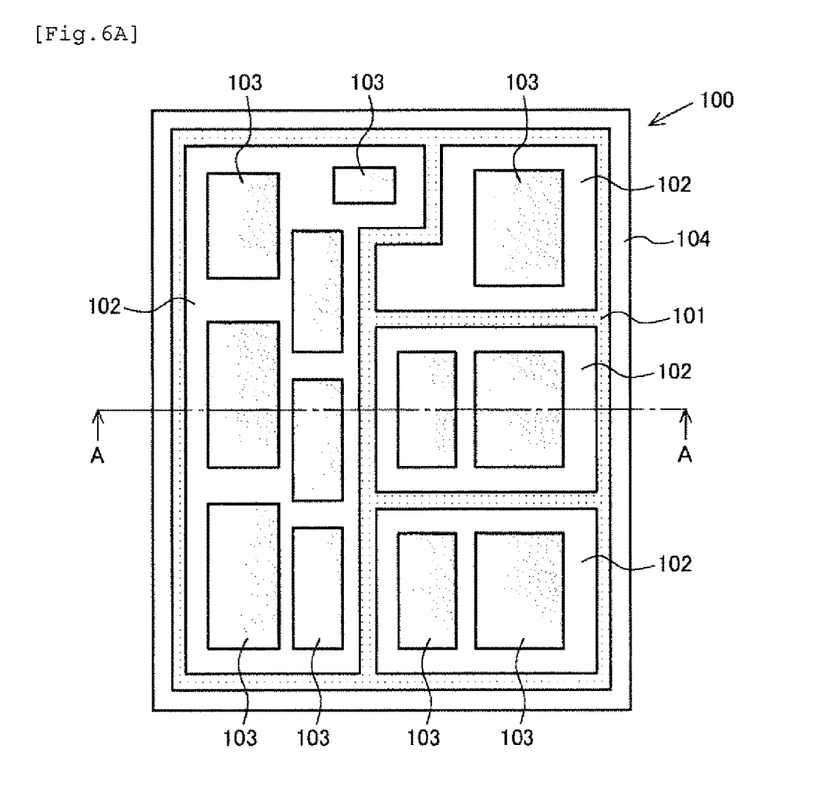
FIGS. 6A and 6B are a plane view and a cross sectional view respectively schematically showing the structure of the insulated circuit board (as a type including no peripheral wall) having a plated layer formed by using the mask for partial plating of the present invention.
Figure 6B:
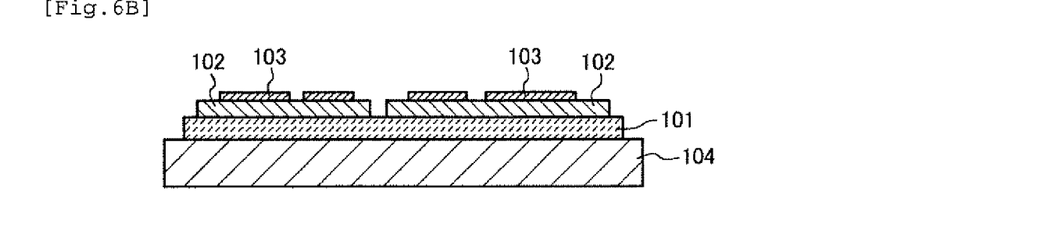

FIGS. 6A and 6B are a plane view and a cross sectional view respectively schematically showing an example of the insulated circuit board (which is a type having no peripheral wall) having a plated layer having been completed by using the mask for partial plating of the present invention. FIG. 6A is a plane view, and FIG. 6B is a cross sectional view on line A-A. The insulated circuit board 100 is the same as in FIGS. 1A and 1B in the arrangement of the metal member 102 and the plated layer 103, and the laminated structure of the members, but the heat radiation base 104 does not have a peripheral wall (i.e., the portion corresponding to the symbol 105 in FIGS. 1A and 1B). In FIG. 6B, the thickness of the plated layer 103 is extremely exaggerated.

Figure 7A:
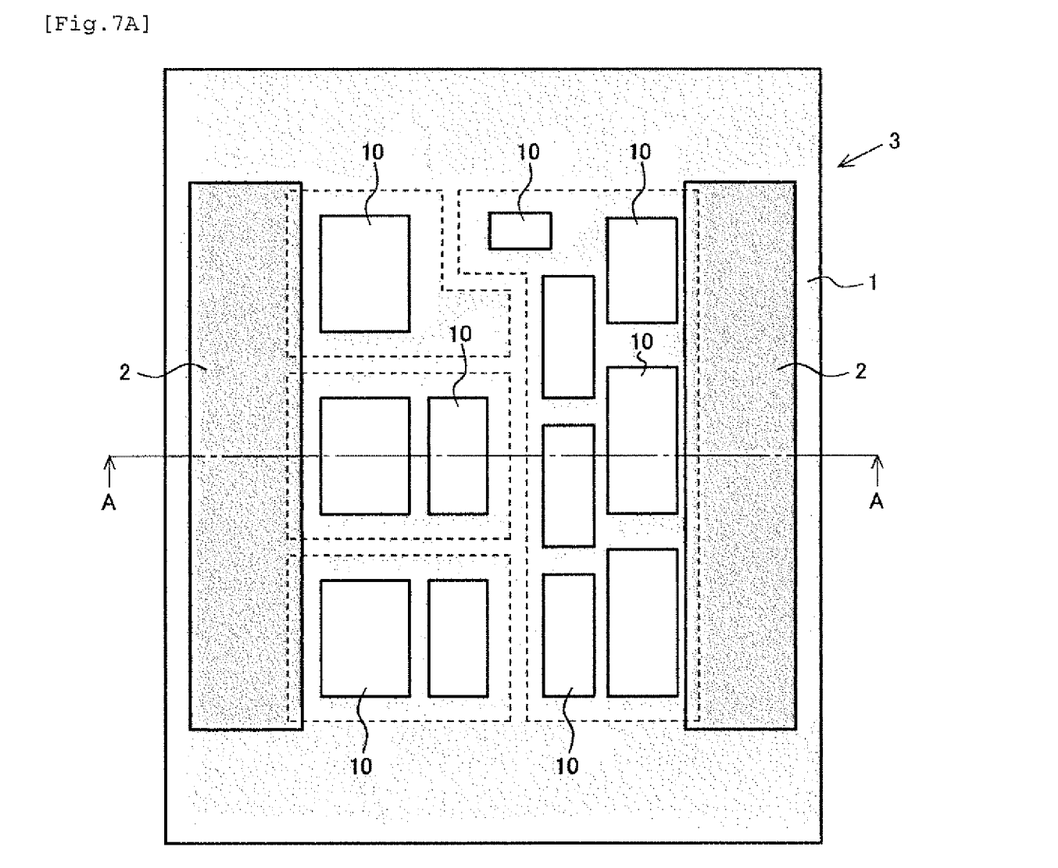
FIGS. 7A and 7B are a plane view and a cross sectional view respectively schematically showing the structure of the mask for partial plating of the present invention as a type including the conductive sheet member that is engaged in a recessed portion formed on the surface of the insulated sheet member.
Figure 7B:
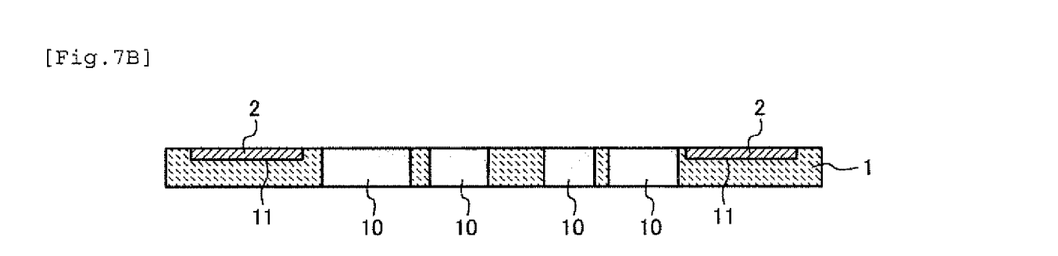

FIGS. 7A and 7B schematically show the structure of the mask for partial plating of the present invention used for forming the plated layer on the insulated circuit board shown in FIGS. 6A and 6B. FIG. 7A is a plane view, and FIG. 7B is a cross sectional view on line A-A. In FIG. 7A, the regions overlapping the metal member 102 in the insulated circuit board 100 in FIGS. 6A and 6B are shown by the broken lines for convenience. The mask for partial plating 3 is a type including the conductive sheet member 2 that is engaged in the recessed portion 11 formed on the surface of the insulated sheet member 1. In the cross sectional structure, there is no step between the surface of the conductive sheet member 2 and the surface of the insulated sheet member 1 (i.e., $\delta = 0$), as similar to the example shown in FIG. 4.

Figure 8:
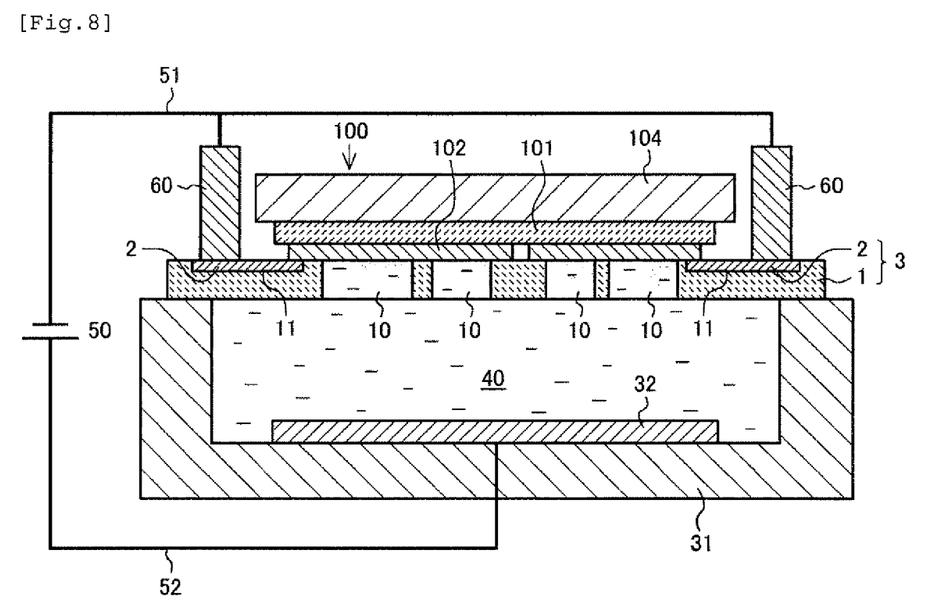
FIG. 8 is a cross sectional view schematically showing the cross sectional structure of the state where the mask for partial plating shown in FIGS. 7A and 7B and an insulated circuit board are disposed in a plating solution tank.

FIG. 8 schematically shows an example of the cross sectional structure of the state where the mask for partial plating of the present invention shown in FIGS. 7A and 7B and an insulated circuit board are disposed in a plating solution tank. The figure shows the cross section corresponding to the cross section on line A-A in FIGS. 7A and 7B. As similar to the example shown in FIG. 5, the surface of the metal member 102 is brought closely into contact with the insulated sheet member 1 and the conductive sheet member 2 over the entire region except for the opening 10, provided that the heat radiation base 104 does not have a peripheral wall (i.e., the portion corresponding to the symbol 105 in FIG. 5). Accordingly, electricity cannot be supplied to the conductive sheet member 2 directly via the heat radiation base 104. In this case, as shown in the figure, electricity can be supplied by bringing an external electrode 60 on the cathode side into contact with a portion of the exposed surface of the conductive sheet member 2. Electricity on the cathode side is supplied from the external electric power source 50 to the metal member 102 via the conductive wire 51, the external electrode 60, and the conductive sheet member 2. On the other hand, electricity on the anode side is supplied from the external electric power source 50 to the anode electrode 32 disposed inside the plating solution tank 31 via the conductive wire 52, as similar to the case of FIG. 3.

The insulated circuit board or an intermediate product thereof may also be a product including a ceramic board as the insulated board, and a heat radiation member provided on the back side of the insulated board opposite to the circuit metal member for forming the plated layer. The ceramic board preferably contains as a major component aluminum nitride (AlN), silicon nitride, alumina, or the like, and the circuit metal member and the heat radiation member each are preferably aluminum, an aluminum alloy, copper, or a copper alloy. The ceramic board, the circuit metal member, and the heat radiation member may be bonded by a known method. Examples of the method include a brazing method of bonding with a brazing material, a direct bonding method of contacting and heating the members in a prescribed atmosphere, and a molten metal bonding method of disposing the ceramic board in a cast mold, and charging and solidifying a molten metal in the cast mold.

EXAMPLES

Example 1

An insulated circuit board having the same laminated structure as shown in FIGS. 1A and 1B (provided that the plated layer had not yet been formed) was prepared. The arrangement of the metal member (denoted by the symbol 102 in FIGS. 1A and 1B) was also analogous to FIGS. 1A and 1B. The islands of the metal member were electrically isolated on the insulated board. The insulated board (denoted by the symbol 101 in FIGS. 1A and 1B) was an aluminum nitride board having a dimension of 67 mm×71 mm×0.6 mm. The metal member (denoted by the symbol 102 in FIGS. 1A and 1B) bonded thereon was a plate material having a thickness of 1.3 mm formed of pure aluminum having a purity of 99.9%. The heat radiation base (denoted by the symbol 104 in FIGS. 1A and 1B) bonded to the back surface of the insulated board was also formed of pure aluminum having a purity of 99.9%, and had a peripheral wall (denoted by the symbol 105 in FIGS. 1A and 1B) having a height that was substantially the same as the surface of the metal member. The thickness of the heat radiation base was 3 mm at the back surface of the insulated board. The aluminum nitride board, and the metal member and the heat radiation member formed of aluminum were bonded by the molten metal bonding method.

As a mask for subjecting two sheets of the insulated circuit boards to partial electroplating, a mask for partial plating shown in FIG. 4 of the type having the conductive sheet member (denoted by the symbol 2 in FIG. 4) engaged in the recessed portion (denoted by the symbol 11 in FIG. 4) formed on the surface of the insulated sheet member (denoted by the symbol 1 in FIG. 4) was produced in the following manner.

The insulated sheet member was produced by the "adhesion method" described in the section "Example of Production Method of Insulated Sheet Member having Recessed Portion" above, in which the first insulated sheet having a flat shape and the second insulated sheet having an opening punched out at the portion corresponding to the recessed portion were adhered to each other. The material of the insulated sheets was insulated silicone rubber. After the adhesion, the opening (denoted by the symbol 10 in FIG. 4) corresponding to the portion to be plated was formed. The resulting insulated sheet member had a thickness (i.e., a thickness except for the recessed portion) of 4 mm, and the recessed portion had a depth of 1 mm, a width of 7 mm, and a length of 64 mm. For masking two insulated circuit boards arranged adjacently to each other, the dimension of the insulated sheet member viewed in the thickness direction was 280 mm×100 mm.

Four sheets of titanium plates having a dimension of 64 mm×7 mm×1 mm were prepared as the conductive sheet members. The titanium plate had a volume resistivity of 42 µΩ·cm. The titanium plates were engaged in the recessed portions of the insulated sheet member, so as to provide a mask for partial plating having an electricity supplying function. The conductive sheet member was fixed only with the elastic force of the insulated silicone rubber generated by engaging the conductive sheet member to the recessed portion. There was no step between the conductive sheet member and the insulated sheet member (δ=0). The distance d from the end of the conductive sheet member to the nearest opening was approximately 1 mm in all the conductive sheet members.

The mask for partial plating was disposed in a plating solution tank, two insulated circuit boards described above was placed thereon. The cross sectional structure obtained herein was approximately the same as in FIG. 5. Another insulated circuit board was set on the back side of the cross section shown in FIG. 5. A prescribed load was applied to each of the two insulated circuit boards, so as to retain the close contact of the insulated circuit boards and the mask for partial plating. A titanium anode electrode (denoted by the symbol 32 in FIG. 5) was used. The plating solution was a Ni plating solution (Watts solution), and the plating temperature was 50° C.

A plated layer having an average thickness of 10 µm was formed in this manner (which was the same as in the following examples). The observation of the insulated circuit board after plating revealed that there was no leakage of the plating solution from the opening of the mask, and plating with high dimensional accuracy was achieved.

Example 2

The prescribed portion of the insulated circuit board was subjected to Ni electroplating under the same condition as in Example 1 except that a conductive silicone rubber sheet was used as the conductive sheet member. The conductive silicone rubber sheet had a volume resistivity of 10 Ω·cm. The observation of the insulated circuit board after plating revealed that there was no bleeding of the plated metal (Ni) was found at the edge of the plated portion, and plating with high dimensional accuracy was achieved.

The use of a conductive silicone rubber sheet as the conductive sheet member prevents the conductive sheet member from being reacted with the plating solution due to the high liquid leakage preventing effect thereof. The conductive silicone rubber sheet is inexpensive, and therefore has an advantage that a prolonged lifetime can be achieved without the use of an expensive titanium plate.

Example 3

A mask for partial plating of the type shown in FIGS. 2A to 2C2 having the conductive sheet member adhered to the flat insulated sheet member having no recessed portion was used instead of the mask for partial plating of the type having the conductive sheet member engaged in the recessed portion of the insulated sheet member. The conductive sheet member was formed of SUS304 and had a thickness of 0.01 mm. The prescribed portion of the insulated circuit board was subjected to Ni electroplating in the same manner as in Example 1 except for the above.

The thickness of the insulated sheet member of the mask for partial plating was 4 mm. The SUS304 plate used as the conductive sheet member had a volume resistivity of 72 $\mu\Omega \cdot cm$. The arrangement of the conductive sheet member and the arrangement of the opening viewed in the thickness direction of the mask for partial plating were the same as in Example 1. Accordingly, the distance d from the end of the conductive sheet member to the nearest opening was approximately 1 mm in all the conductive sheet members. The method of adhering the SUS304 plate to the insulated sheet member (i.e., the insulated silicone rubber sheet) was an adhesion method with a double-sided adhesive tape (Nicetack, available from Nichiban Co., Ltd., thickness: 0.09 mm). The step $\delta$ between the surface of the conductive sheet member and the exposed surface of the insulated sheet member was approximately 0.1 mm. The cross sectional structure of the mask for partial plating placed in a plating solution tank having placed thereon two insulated circuit boards was substantially the same as in FIG. 3. Another insulated circuit board was set on the back side of the cross section shown in FIG. 3.

The observation of the insulated circuit board after plating revealed that leakage of the plating solution from the opening of the mask was found, and bleeding of the plated metal (Ni) was found only slightly at the edge of the plated portion. However, the leakage of the plating solution was such an extent that did not cause an operational problem, and it was determined that there was no practical problem in dimensional accuracy of the resulting plated layer.

Example 4

The prescribed portion of the insulated circuit board was subjected to Ni electroplating under the same condition as in Example 3 except that a SUS304 plate having a thickness of 0.03 mm was used as the conductive sheet member adhered to the surface of the flat insulated sheet member. The SUS304 plate had a volume resistivity of 72 $\mu\Omega \cdot cm$. The step $\delta$ described above was approximately 0.12 mm. The observation of the insulated circuit board after plating revealed that leakage of the plating solution from the opening of the mask was found, and bleeding of the plated metal (Ni) was found only slightly at the edge of the plated portion. However, the leakage of the plating solution was such an extent that did not cause an operational problem, and it was determined that there was no practical problem in dimensional accuracy of the resulting plated layer.

Example 5

The prescribed portion of the insulated circuit board was subjected to Ni electroplating under the same condition as in Example 3 except that a SUS304 plate having a thickness of 0.05 mm was used as the conductive sheet member adhered to the surface of the flat insulated sheet member. The SUS304 plate had a volume resistivity of 72 $\mu\Omega \cdot cm$. The step $\delta$ described above was approximately 0.14 mm. The observation of the insulated circuit board after plating revealed that leakage of the plating solution from the opening of the mask was found, and bleeding of the plated metal (Ni) was found at some places of the edge of the plated portion. However, the leakage of the plating solution was such an extent that did not cause an operational problem, and it was determined that there was no practical problem in dimensional accuracy of the resulting plated layer.

Example 6

The prescribed portion of the insulated circuit board was subjected to Ni electroplating under the same condition as in Example 3 except that a SUS304 plate having a thickness of 0.1 mm was used as the conductive sheet member adhered to the surface of the flat insulated sheet member. The SUS304 plate had a volume resistivity of 72 $\mu\Omega \cdot cm$. The step $\delta$ described above was approximately 0.19 mm. The observation of the insulated circuit board after plating revealed that leakage of the plating solution from the opening of the mask was found, and bleeding of the plated metal (Ni) was found over the entire edge of the plated portion. However, the leakage of the plating solution was such an extent that did not cause an operational problem, and it was determined that there was no practical problem in dimensional accuracy of the resulting plated layer.

Example 7

The prescribed portion of the insulated circuit board was subjected to Ni electroplating under the same condition as in Example 3 except that a lead plate having a thickness of 0.1 mm was used as the conductive sheet member adhered to the surface of the flat insulated sheet member. The lead plate had a volume resistivity of 20.8 $\mu\Omega \cdot cm$. The step $\delta$ described above was approximately 0.19 mm. The observation of the insulated circuit board after plating revealed that leakage of the plating solution from the opening of the mask was found, and bleeding of the plated metal (Ni) was found over the entire edge of the plated portion. However, the leakage of the plating solution was such an extent that did not cause an operational problem, and it was determined that there was no practical problem in dimensional accuracy of the resulting plated layer.

Example 8

The prescribed portion of the insulated circuit board was subjected to Ni electroplating under the same condition as in Example 3 except that a conductive silicone rubber sheet having a thickness of 0.5 mm was used as the conductive sheet member adhered to the surface of the flat insulated sheet member. The conductive silicone rubber sheet had a volume resistivity of 10 $\mu\Omega \cdot cm$. The step $\delta$ described above was approximately 0.59 mm. The observation of the insulated circuit board after plating revealed that leakage of the plating solution from the opening of the mask was found, and bleeding of the plated metal (Ni) was found over the entire edge of the plated portion. However, the leakage of the plating solution was such an extent that did not cause an operational problem, and it was determined that there was no practical problem in dimensional accuracy of the resulting plated layer.

Example 9

The prescribed portion of the insulated circuit board was subjected to Ni electroplating under the same condition as in Example 3 except that an aluminum plate having a thickness of 0.05 mm was used as the conductive sheet member adhered to the surface of the flat insulated sheet member. The aluminum plate had a volume resistivity of 2.7 μΩ·cm. The step δ described above was approximately 0.14 mm. The observation of the insulated circuit board after plating revealed that leakage of the plating solution from the opening of the mask was found, and bleeding of the plated metal (Ni) was found at some places of the edge of the plated portion. However, the leakage of the plating solution was such an extent that did not cause an operational problem, and it was determined that there was no practical problem in dimensional accuracy of the resulting plated layer.

Example 10

The prescribed portion of the insulated circuit board was subjected to Ni electroplating under the same condition as in Example 3 except that a copper plate having a thickness of 0.05 mm was used as the conductive sheet member adhered to the surface of the flat insulated sheet member. The copper plate had a volume resistivity of 1.7 μΩ·cm. The step δ described above was approximately 0.14 mm. The observation of the insulated circuit board after plating revealed that leakage of the plating solution from the opening of the mask was found, and bleeding of the plated metal (Ni) was found at some places of the edge of the plated portion. However, the leakage of the plating solution was such an extent that did not cause an operational problem, and it was determined that there was no practical problem in dimensional accuracy of the resulting plated layer.

Example 11

The prescribed portion of the insulated circuit board was subjected to Ni electroplating under the same condition as in Example 3 except that an aluminum plate having a thickness of 0.05 mm was used as the conductive sheet member adhered to the surface of the flat insulated sheet member, and the distance d to the opening 10 was zero. The aluminum plate had a volume resistivity of 2.7 μω·cm. The step δ described above was approximately 0.14 mm. In this case, the amount of the plated metal attached to the end surface of the conductive sheet member was larger than the other examples. It is considered that the lifetime of the mask is shorter than in the other examples, in consideration of the securement of the dimensional accuracy and the suppression of the foreign matter incorporation. The observation of the insulated circuit board after plating revealed that leakage of the plating solution from the opening of the mask was found, and bleeding of the plated metal (Ni) was found at some places of the edge of the plated portion. However, the leakage of the plating solution was such an extent that did not cause an operational problem, and it was determined that there was no practical problem in dimensional accuracy of the resulting plated layer.

In the examples shown above, the insulated circuit board as the member to be plated had electrically isolated island of the metal member before plating, which negated the necessity of the formation and removal of a resist film requiring much time and labor in the plating step or the subsequent steps. Furthermore, it was confirmed that the mask for partial plating of the present invention having the electricity supplying function to the isolated islands exerted performance that sufficiently satisfied the industrial mass production, irrespective of the simple structure employed thereby.

What is claimed is:

1. A method for producing an insulated circuit board including a circuit metal member having formed thereon a plated layer from an intermediate product, wherein the intermediate product of an insulated circuit board includes an insulated board having and one or plural electrically isolated circuit metal members formed on one surface of the insulated board, and a prescribed portion on a surface of the circuit metal member is selectively electroplated, the method comprising using a mask for partial plating, wherein the mask for partial plating comprises an insulated sheet member having an opening corresponding to the prescribed portion, and having a structure including a partial region on one surface in the thickness direction of the insulated sheet member being coated with one or plural conductive sheet members attached to the partial region, disposing the opening formed in the mask to the prescribed portion to be plated on the surface of the circuit metal member for forming the plated layer, bringing the prescribed portion into contact with a plating solution, allowing one or plural conductive sheet members exposed on the surface of the mask to be brought into contact with a portion not to be plated on the surface of the circuit metal member for forming the plated layer and an electrode connected to an external electric power source, and supplying electricity to the circuit metal member for forming the plated layer, via one or plural conductive sheet members so as to perform electroplating.

2. The method for producing an insulated circuit board according to claim 1, wherein the intermediate product of the insulated circuit board includes a ceramic board as the insulated board, and a heat radiation member provided on a back side of the insulated board opposite to the circuit metal member for forming the plated layer.

3. The method for producing an insulated circuit board according to claim 2, wherein the heat radiation member is a conductor having a peripheral wall surrounding a part or the whole of end surfaces of the insulated board, and electricity is supplied to the circuit metal member for forming the plated layer by using the peripheral wall of the heat radiation member as the electrode connected to an external electric power source, and bringing one or plural conductive sheet members into contact with the peripheral wall.

4. The method for producing an insulated circuit board according to claim 1, wherein electricity is supplied to the circuit metal member for forming the plated layer by using the electrode connected to an external electric power source.

5. The method for producing an insulated circuit board according to claim 1, wherein electricity is supplied to the plural circuit metal members for forming the plated layer via a single conductive sheet member disposed to be brought into contact simultaneously with the plural circuit metal members.

6. The method for producing an insulated circuit board according to claim 1, wherein one or plural conductive sheet members are adhered to the surface of the insulated sheet member.

7. The method for producing an insulated circuit board according to claim 1, wherein one or plural conductive sheet members are engaged in a recessed portion formed on the surface of the insulated sheet member.

8. A partial plating method comprising performing electroplating selectively on a prescribed portion on a surface of one or plural electrically isolated circuit metal members formed on one surface of an insulated board, the method comprising:

using a mask for partial plating, wherein the mask for partial plating comprises an insulated sheet member having an opening corresponding to the prescribed portion, and having a structure including a partial region on one surface in the thickness direction of the insulated sheet member being coated with one or plural conductive sheet members attached to the partial region, disposing the opening formed in the mask to the prescribed portion to be plated on the surface of the circuit metal member for forming a plated layer, bringing the prescribed portion into contact with a plating solution, allowing one or plural conductive sheet members exposed on the surface of the mask to be brought into contact with a portion not to be plated on the surface of the circuit metal member for forming the plated layer and an electrode connected to an external electric power source, and supplying electricity to the circuit metal member for forming the plated layer, via one or plural conductive sheet members, so as to perform electroplating.

9. The partial plating method according to claim 8, wherein the insulated board is a ceramic board having a heat radiation member provided on a back side thereof opposite to the circuit metal member for forming the plated layer.

10. The partial plating method according to claim 9, wherein the heat radiation member is a conductor having a peripheral wall surrounding a part or the whole of end surfaces of the insulated board, and electricity is supplied to the circuit metal member for forming the plated layer by using the peripheral wall of the heat radiation member as the electrode connected to an external electric power source, and bringing one or plural conductive sheet members into contact with the peripheral wall.

11. The partial plating method according to claim 8, wherein electricity is supplied to the circuit metal member for forming the plated layer by using an external electrode as the electrode connected to an external electric power source.

12. The partial plating method according to claim 8, wherein electricity is supplied to the plural circuit metal members for forming the plated layer via a single conductive sheet member disposed to be brought into contact simultaneously with the plural circuit metal members.

13. The partial plating method according to claim 8, wherein one or plural conductive sheet members are adhered to the surface of the insulated sheet member.

14. The partial plating method according to claim 8, wherein one or plural conductive sheet members are engaged in a recessed portion formed on the surface of the insulated sheet member.

* * * * *